US010333050B2

(12) United States Patent
Falter et al.

(10) Patent No.: US 10,333,050 B2
(45) Date of Patent: Jun. 25, 2019

(54) METHOD FOR PRODUCING A COMPOSITE COMPRISING A HIGH-TEMPERATURE SUPERCONDUCTOR (HTS) LAYER (71) Applicant: BASF SE, Ludwigshafen (DE)

(72) Inventors: Martina Falter, Swisttal-Buschhoven (DE); Oliver Thiems, Bonn (DE); Michael Baecker, Cologne (DE)

(73) Assignee: BASF SE, Ludwigshafen (DE)

( * ) Notice: Subject to any disclaimer, the term of this patent is extended or adjusted under 35 U.S.C. 154(b) by 315 days.

(21) Appl. No.: 15/320,640

(22) PCT Filed: Jun. 3, 2015

(86) PCT No.: PCT/EP2015/062414
§ 371 (c)(1),
(2) Date: Dec. 20, 2016

(87) PCT Pub. No.: WO2015/197334
PCT Pub. Date: Dec. 30, 2015

(65) Prior Publication Data
US 2018/0123015 A1  May 3, 2018

(30) Foreign Application Priority Data

Jun. 24, 2014 (EP) .................................. 14173771

(51) Int. Cl.
*H01L 39/12* (2006.01)
*H01L 39/24* (2006.01)
(52) U.S. Cl.
CPC ........ *H01L 39/2425* (2013.01); *H01L 39/128* (2013.01); *H01L 39/2467* (2013.01)
(58) Field of Classification Search
None
See application file for complete search history.

(56) References Cited

U.S. PATENT DOCUMENTS

2006/0014304 A1* 1/2006 Hahakura ........... H01L 39/2422
438/2
2007/0197397 A1* 8/2007 Backer ................ C23C 18/1216
505/430

(Continued)

FOREIGN PATENT DOCUMENTS

CN    1364322 A    8/2002
CN    1117879 C    8/2003

(Continued)

OTHER PUBLICATIONS

International Search Report dated Aug. 7, 2015, in PCT/EP2015/062414, filed Jun. 3, 2015.

(Continued)

*Primary Examiner* — Colleen P Dunn
(74) *Attorney, Agent, or Firm* — Oblon, McClelland, Maier & Neustadt, L.L.P.

(57) ABSTRACT

The invention relates to a method for producing a composite comprising a high-temperature superconductor (HTS) layer based on rare earth metal-barium-copper oxide on a substrate with defined biaxial texture, having the following steps: applying a first HTS coating solution to the substrate, drying the first HTS coating solution to produce a first film, pyrolyzing the first film to produce a first pyrolyzed sublayer, removing an interfacial layer on the upper side of the first pyrolyzed sublayer to produce a first pyrolyzed sublayer with reduced layer thickness, applying a second HTS coating solution to the first pyrolyzed sublayer with reduced layer thickness, drying the second HTS coating solution to produce a second film, pyrolyzing the second film to produce a second pyrolyzed sublayer, optionally forming one or more further pyrolyzed sublayers on the second pyrolyzed sublayer, and crystallizing the overall layer formed from the pyrolyzed sublayers to complete the HTS layer, wherein the removal of the interfacial layer in step D) is effected in such (Continued)

a way that a texture determined by the defined biaxial texture of the substrate is transferred to the first and also to the second pyrolyzed sublayer, and also to a product producible by such a method.

15 Claims, 5 Drawing Sheets

(56) References Cited

U.S. PATENT DOCUMENTS

| | | | |
|---|---|---|---|
| 2010/0015340 A1* | 1/2010 | Clem | C23C 18/1216 427/372.2 |
| 2010/0173785 A1* | 7/2010 | van Driessche | C23C 18/1216 505/447 |

FOREIGN PATENT DOCUMENTS

| | | |
|---|---|---|
| CN | 1497614 A | 5/2004 |
| DE | 100 05 861 A1 | 10/2000 |
| DE | 101 43 680 C1 | 5/2003 |
| DE | 10 2004 041 053 A1 | 3/2006 |
| DE | 10 2008 004 818 A1 | 7/2009 |
| EP | 1 667 174 A1 | 6/2006 |
| FR | 2 940 323 A1 | 6/2010 |
| JP | 2011-159453 | 8/2011 |
| JP | 2012-151018 | 8/2012 |

OTHER PUBLICATIONS

European Search Report, dated Apr. 15, 2015, in priority application EP 14173771.8, filed Jun. 24, 2014 (with Translation of category of cited documents in attached foreign language search report).
Obradors et al., "Progress towards all-chemical superconducting $YBa_2Cu_3O_7$-coated conductors", Superconductor science and technology, vol. 19, No. 3, XP 020100846, S13-S26, Jan. 2006.
Knoth et al., "Chemical solution deposition of $YBa_2Cu_3O_7$-x coated conductors", Current opinion in Solid State and Materials Science, vol. 10, No. 5-6, XP 022258482, p. 205-216, 2006.
Grivel et al., "Preparation and characterization of $Bi_2Sr_2CaCu_2O_8$+[delta] thin films on MgO single crystal substrates by chemical solution deposition", Physica C, vol. 486, XP 028529260, p. 32-36, 2013.
Dawley et al., "Thick Sol-gel Derived $YBa_2Cu_3O_7$-[delta] Films", IEEE Transactions on applied superconductivity, vol. 11, No. 1, XP 011090933, Mar. 2001, p. 2873-2876.
Combined Chinese Office Action and Search Report dated Aug. 1, 2018 in Patent Application No. 201580034041.5 (with English language translation of categories of cited documents).
Office Action dated Mar. 19. 2019, in Japanese Patent Application No. 2016-575521, filed Jun. 3, 2015.

* cited by examiner

METHOD FOR PRODUCING A COMPOSITE COMPRISING A HIGH-TEMPERATURE SUPERCONDUCTOR (HTS) LAYER

TECHNICAL FIELD

The invention relates to a method for producing a composite comprising a high-temperature superconductor (HTS) layer and to a product obtainable by such a method.

PRIOR ART

High-temperature superconductors (HTS) in ribbon form, also referred to as coated conductors, comprise a (typically metallic) carrier in ribbon form, to which at least one superconductive functional layer is applied, optionally after prior application of one or more intermediate or buffer layers.

An essential factor in the production of coated conductors is the requirement that the superconductive layer has to have an extremely high biaxial texture, i.e. crystallographic orientation. The individual crystallites of the superconductive layer may only be tilted with respect to one another to a minor degree, in order not to impair the superconductive properties (High Temperature Superconductivity 1: Materials, A. V. Narlikar (ed.) Springer-Verlag, 2004, 115-167).

In order to achieve such a high level of texture, two different approaches to production are pursued. In both approaches, metallic carriers are used, because only in this way can the strength of the end products required for later use be achieved. Furthermore, in both approaches, the application of the superconductive layer is preceded by production of at least one biaxially textured intermediate or buffer layer which transfers its texture to the superconductive layer when it is formed.

In the first approach, the starting material is an untextured, i.e. crystallographically unoriented, metallic carrier, to which the buffer layer is subsequently applied with an orientation. Such directed deposition can be effected only by means of physical coating methods, for example ion beam assisted deposition (IBAD) and inclined substrate deposition (ISD), under high vacuum. However, these methods are associated with a high level of apparatus complexity.

In the second approach, the metallic carrier is already biaxially textured by specific methods (see, for example, DE 101 43 680 C1, CN 1 117 879 C, DE 100 05 861 A1). This texture of the carrier is then transferred in the subsequent steps, first to the buffer layer and thence to the superconductive layer. Since no directed deposition methods have to be used for the application of the further layers, it is possible here to use either physical methods or, more particularly, chemical methods such as chemical solution deposition (CSD).

Chemical methods such as the CSD method are particularly economically viable, both in terms of plant and operating costs, since they typically proceed at standard pressure and enable a high deposition rate. At the center of current development work are therefore production processes for coated conductors in which first one or more buffer layers and then the superconductive layer are applied to a textured metallic carrier via chemical deposition. Final crystallization annealing then achieves transfer of the biaxial texture of the layer beneath or of the metallic carrier.

The function of the buffer layer(s) is firstly to prevent corrosion of the metal by oxidation, which would result in loss of orientation. Secondly, the diffusion of metal ions such as nickel or iron into the superconductive layer has to be prevented, in order not to impair the quality thereof. In the worst case, the superconductive properties of the material would be lost.

As already explained, a CSD method is an option for the deposition of the buffer layers (and also later for the deposition of the superconductive layer). CSD methods are easily reproducible and can be scaled up with low technical complexity. The growth rates of the layers are much higher than in physical vapor deposition methods, and so the throughput of material is higher, which brings further economic advantages. At present, it is possible to produce high-temperature superconductors in ribbon form having a length of several hundred meters by a CSD method.

In CSD methods, it is possible in principle to distinguish the following three steps:
1. Deposition of the coating solution
2. Drying and pyrolysis
3. Reaction and crystallization Particularly for HTS layers, the production of homogeneous layers of maximum thickness (>1 µm) with oriented crystallization is the aim, in order to transport high critical currents.

If the HTS layer is being applied in one operation, the pyrolysis is found to be very complex and requires relatively long periods of one hour or more. Moreover, in the case of relatively long pyrolysis times, gradients can arise in the element distribution over the entire layer thickness and hence increase the necessary diffusion pathways in the crystallization reaction.

Steps 1 and 2 are therefore advantageously executed in two or more operations each with thin layers, since drying and pyrolysis release large amounts of gas. The application in several operations gives rise to substantially crack- and pore-free intermediate layers.

The prior art (see, for example, EP 1667174 A1) discloses methods for this purpose, in which up to ten (10) layers with a thickness of about 100 nm (the maximum reported is 300 nm) are applied. However, these methods are very time-consuming and costly.

If an attempt is made to conduct steps 1 and 2 with thicker layers (>300 nm), in order to reduce the time taken and costs, however, it is found to be problematic that transport processes at the surface of the pyrolyzed layers can form concentration gradients, which is caused, for example, by precursors/organometallic complexes of different volatility, especially in the pyrolysis step. This is true to a particularly pronounced degree of copper-organofluorine complexes, for example. In this case, there is especially enrichment of CuO in the interfacial layer. These gradients prevent homogeneous crystallization across the interfacial layers in the subsequent crystallization step.

Step 3, by contrast, can be conducted in just one step since extraneous phases are concentrated at the growth front in the crystallization of thick layers (>1 µm) (similarly to a zone melting process). This means that the surfaces of this layer are no longer suitable for subsequent epitaxial growth.

OBJECT OF THE INVENTION

It is therefore an object of the invention to solve the aforementioned problems, i.e. to enable formation of crystals across the interfacial layer between the sublayers in films which are subjected to a joint crystallization process after the application and heat treatment of the individual sublayers, in order to achieve homogeneous crystallization of the overall layer.

SUBJECT MATTER OF THE INVENTION

According to the invention, this object is achieved by a method for producing a composite comprising a high-temperature superconductor (HTS) layer based on rare earth metal-barium-copper oxide on a substrate with defined biaxial texture, comprising the following steps:
A) applying a first HTS coating solution to the substrate;
B) drying the first HTS coating solution to produce a first film;
C) pyrolyzing the first film to produce a first pyrolyzed sublayer;
D) removing an interfacial layer on the upper side of the first pyrolyzed sublayer to produce a first pyrolyzed sublayer with reduced layer thickness;
E) applying a second HTS coating solution to the first pyrolyzed sublayer with reduced layer thickness;
F) drying the second HTS coating solution to produce a second film;
G) pyrolyzing the second film to produce a second pyrolyzed sublayer;
H) optionally forming one or more further pyrolyzed sublayers on the second pyrolyzed sublayer; and
I) crystallizing the overall layer formed from the pyrolyzed sublayers to complete the HTS layer,
wherein the removal of the interfacial layer in step D) is effected in such a way that (in the case of implementation of said subsequent steps) a texture determined by the defined biaxial texture of the substrate is transferred to the first and also to the second pyrolyzed sublayer. Step I) here is the step in which the texture is transferred with the crystallizing. Step D) enables the transfer of the texture.

In this application, "substrate" is understood to mean any carrier material for an HTS layer. This may especially be a metallic carrier or an intermediate or buffer layer as known per se from the prior art.

The expression "NTS coating solution" in this application is understood to mean any solution which, after application, drying, pyrolyzing and crystallizing, gives rise to an HTS layer.

The method of the invention enables, in a surprisingly simple and effective manner, homogenization of overall layers which have been deposited one on top of another in at least two sublayers and have not yet been subjected to a joint crystallization, specifically by intermediate treatment(s) after each component step in the form of removal of interfacial layers present.

This/these intermediate treatment(s) is/are intended to remove interfacial regions having inhomogeneous material properties that are present at the surface. The inhomogeneity may relate to a deviation in the element distribution and/or to a deviation in the material compound that occurs there or the oxidation states that occur there.

The invention is manifested only when an interfacial layer distinctly different from the rest of the sublayer on the basis of measurable parameters is formed in each or at least one of the sublayers applied and processed individually at the time of manufacture, such that controlled removal can be effected.

In a preferred version of the invention, step H) is implemented, with immediately preceding removal of an interfacial layer on the upper side of the respective previous second or further pyrolyzed sublayer.

It is preferable that a sufficient amount of the first pyrolyzed sublayer as interfacial layer is removed in step D) that, after the removal, the mean atomic (Ba+Cu):Y ratio in the upper 10 nm of the first pyrolyzed sublayer is below 8 and/or step H) is preceded by removal of a sufficient amount of the respective previous second or further sublayer as interfacial layer that, after the removal, the mean atomic (Ba+Cu):Y ratio in the upper 10 nm of the respective previous second or further sublayer is below 8.

The removal of the copper- and barium-rich interfacial layer to this degree ensures optimal intertwining of the crystallization through the respective sublayer, without having to remove too much material, as apparent from the spectroscopic measurements elucidated below in the examples.

The best results are achieved when the mean atomic (Ba+Cu):Y ratio is actually below 6.

It is also preferable that 1% to 20% of the first pyrolyzed sublayer as interfacial layer is removed in step D), based on the layer thickness of the first pyrolyzed sublayer, and/or step H) is preceded by removal of 1% to 20% of the respective previous second or further pyrolyzed sublayer as interfacial layer, based on the layer thickness of the respective previous second or further sublayer. By this measure, it is likewise possible to ensure that the interfacial layers that disrupt crystallization through the overall layer are removed to a sufficient degree without giving rise to excessive material loss.

The amount of material removed is preferably 1% to 10%, more preferably 2% to 5%.

The interfacial layer is preferably removed in a mechanical, chemical and/or physical manner.

The interfacial layer is preferably removed by ultrasound, abrasion, irradiation, etching, pickling, plasma etching or dissolving in a suitable solvent, optionally in combination with one another or with other mechanical, chemical or physical treatment steps.

In a particularly preferred embodiment of the invention, the interfacial layer is removed with ultrasound in a suitable solvent, preferably an alcohol, more preferably ethanol.

In an alternative embodiment, the interfacial layer can be removed by brushing and/or wiping.

In addition, in accordance with the invention, the interfacial layer can be removed by using plasma or beams of particles, of atoms and/or of molecules.

In a particularly preferred embodiment of the invention, it may be the case that the HTS coating solution used is a solution for formation of a rare earth-barium-copper oxide layer, especially an yttrium-barium-copper oxide layer.

It is preferable in accordance with the invention that a total of 2, 3, 4 or 5, more preferably 2 or 3, pyrolyzed sublayers are formed.

In the context of the invention, it may be the case that the compositions of the respective coating solutions are different.

In this way, it is possible to achieve a controlled variation of stoichiometry within the overall layer formed from sublayers, which may be highly desirable for particular purposes (see example 4).

It may also be the case in accordance with the invention that the pyrolyzed sublayers are formed in different layer thicknesses.

The layer thicknesses of the pyrolyzed sublayers are preferably between 400 and 800 nm.

It is particularly preferable in accordance with the invention that the overall layer is formed in a layer thickness between 800 and 2000 nm. The invention further relates to a composite comprising, on a substrate with defined texture, a high-temperature superconductor (HTS) layer comprising rare earth-barium-copper oxide,
wherein the HTS layer consists of a plurality of sublayers deposited one on top of another, in each of the sublayers there is variation in the atomic (Ba+Cu):Y ratio in the direction at right angles to the substrate surface and in each of the sublayers, with or without the exception of the uppermost sublayer, every sublayer of thickness 10 nm that extends parallel to the substrate surface is constituted such that the mean of said atomic ratio is not more than 8.

In a first alternative, it is thus the case that, in each of the sublayers (not excluding the uppermost sublayer, i.e. including the uppermost sublayer), every sublayer of thickness 10 nm that extends parallel to the substrate surface is constituted such that the mean of said atomic ratio is not more than 8. In this alternative, it is thus the case for the uppermost sublayer too that every sublayer of thickness 10 nm that extends parallel to the substrate surface is constituted such that the mean of said atomic ratio is not more than 8.

And, according to a second alternative, it is thus the case that, in each of the sublayers, except for the uppermost sublayer, every sublayer of thickness 10 nm that extends parallel to the substrate surface is constituted such that the mean of said atomic ratio is not more than 8. In this alternative, the uppermost sublayer may have a different constitution, especially because the copper-rich interfacial layer has not been removed.

In this context, the composite of the invention is preferably producible by the method of the invention.

Preference is given to a composite in which the overall layer composed of pyrolyzed sublayers after the crystallizing in step I), in more than 80% of the volume, has a texture defined by the defined texture of the substrate.

More preferably, the composite is an HTS in ribbon form.

The drawings which follow serve to further illustrate the invention. The drawings show.

Figure 5:
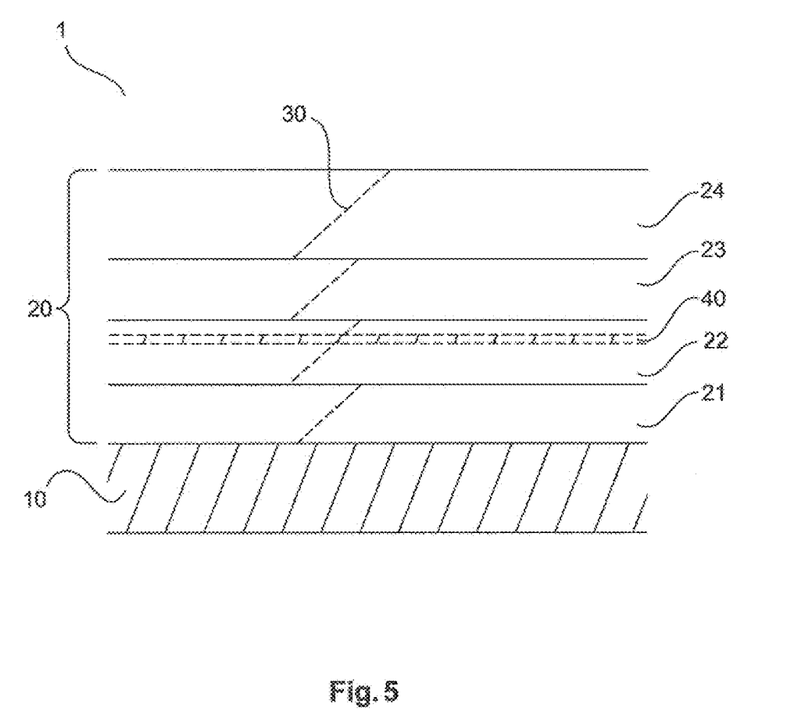

An illustrative composite 1 as preparable by the method of the invention is shown in FIG. 5. In this case, an HTS layer 20 having a total of four sublayers 21, 22, 23 and 24 has been applied on the substrate 10. In the first three sublayers 21, 22 and 23, in each case prior to the application of the next sublayer, the intermediate cleaning described above and still to be elucidated in more detail below in the examples for removal of the copper-rich interfacial layer has been undertaken. The uppermost sublayer 24 has not been subjected to this treatment.

The atomic (Ba+Cu):Y ratios which vary across the sublayers are indicated schematically by the dotted lines 30 that run obliquely in each of the sublayers. For characterization of the composite of the invention, in one of the sublayers 21, 22, 23, the methods described in detail below in the examples are now used to determine the mean of the atomic ratio mentioned in a sublayer 40 that runs parallel to the substrate 10 and is positioned at any point in one of the sublayers (in FIG. 5, by way of example, in sublayer 22). It is found here that this never exceeds the value of 8 in the composite of the invention in all sublayers (21, 22, 23)— except for the uppermost sublayer (24), in which, in this working example, no removal of the copper-rich upper interfacial layer took place. It will be appreciated that the uppermost sublayer 24 may alternatively be configured such that said value is not exceeded.

Further features and advantages of the invention will be apparent from the following examples:

EXAMPLE 1

In the production of biaxially textured yttrium-barium-copper oxide (YBCO) layers in the CSD method, a Ba- and Cu-rich interfacial layer forms after the pyrolysis of the individual layers. The rare earth metal, yttrium in this case, is barely represented therein.

If two or more layers are to be deposited one on top of another and jointly crystallized, in the case of a heterogeneous crystallization, the crystallization front which arises at the interface between the carrier or the buffer layer and the HTS layer has to grow between the individually deposited sublayers across the inhomogeneous interface region. In the interface region, there is a higher Cu concentration than in the rest of the layer, probably in the form of CuO. For the desired crystallization to give $YBa_2Cu_3O_x$ (6<x<7), Cu would have to be oxidized, but this is not possible under the crystallization conditions employed. This blockage prevents homogeneous through-crystallization of the overall layer. It is observed here that incorrectly textured polycrystalline material occurs more frequently above the interfacial layers and the proportion of foreign phases is higher.

The procedure, now, in accordance with the invention is that a first single YBCO layer is first deposited from solution, dried and pyrolyzed, with a standard temperature profile for such a method. Deposition, drying and pyrolysis take place in direct succession in the same system (reel-to-reel pyrolysis oven). The pyrolysis proceeds under a gas stream of 500 L/h of $N_2$+200 L/h of $O_2$+12 g/h of $H_2O$. This invariably forms an interfacial layer which is enriched in Cu and Ba and typically makes up between 1% and 10% of the layer, not more than 20%.

In the next step, this interfacial region is removed, in the present example by ultrasound treatment (30 m/h) in ethanol (treatment time: about 2 min). After this intermediate treatment, the next sublayer is deposited, dried and pyrolyzed under the same conditions. When the intention is to deposit a further sublayer on top, the interfacial layer is first removed again at this point. Otherwise, the homogenized overall layer is now through-crystallized under a gas stream of 400 L/h of $N_2$, moistened with 23 g/h of $H_2O$, +1.4 L/h of $O_2$+220 L/h of $N_2$ (dry), with a standard temperature profile for such a method. According to the length of the workpiece to be processed, it is possible here to work under vacuum or without vacuum. The result is homogeneous, textured crystal growth through the entire layer package.

Figure 1A:
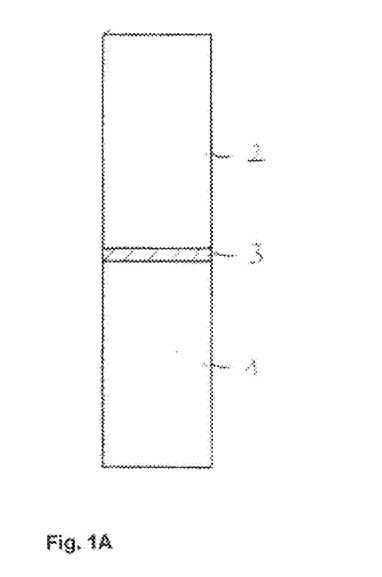
FIG. 1 a schematic diagram of the results of FIB-TEM-EDX measurements on YBCO sublayers applied one on top of another (FIG. 1A without intermediate cleaning, FIG. 1B with intermediate cleaning)
Figure 1B:
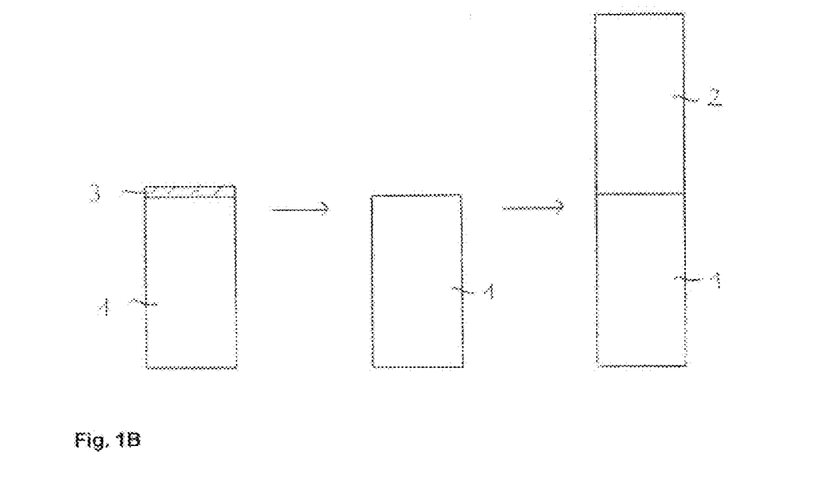

To illustrate the effect of the intermediate treatment, FIG. 1 shows, in schematic form, the results of FIB (focused ion beam)-TEM (transmission electron microscopy)-EDX (energy dispersive x-ray spectroscopy) measurements, with FIG. 1A relating to measurements on two sublayers 1 and 2 one on top of another without intermediate cleaning and FIG. 1B to measurements on two sublayers 1 and 2 with intermediate cleaning. This intermediate cleaning effectively removes the copper oxide-rich interfacial layer clearly apparent as a hatched strip 3 in FIG. 1A, which would otherwise impair the through-crystallization of sublayer 1 into sublayer 2.

Figure 2:
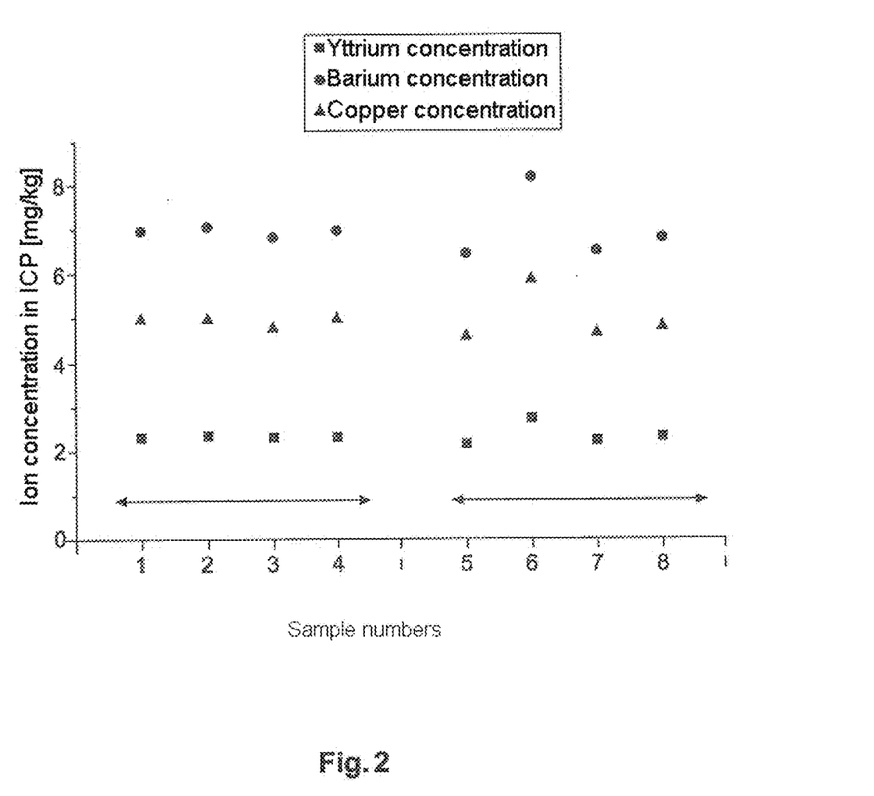
FIG. 2 the ion concentration in a YBCO layer without (left) and with (right) ultrasound treatment in ethanol.

A portion of the cleaned layer is brought into solution by means of dilute nitric acid and analyzed by means of ICP-OES (inductively coupled plasma—optical emission spectroscopy). The cleaning or rinse solution is likewise analyzed. FIG. 2 shows measurement results for uncleaned samples (sample numbers 1 to 4) and samples after ultrasound treatment (sample numbers 5 to 8).

Figure 3:
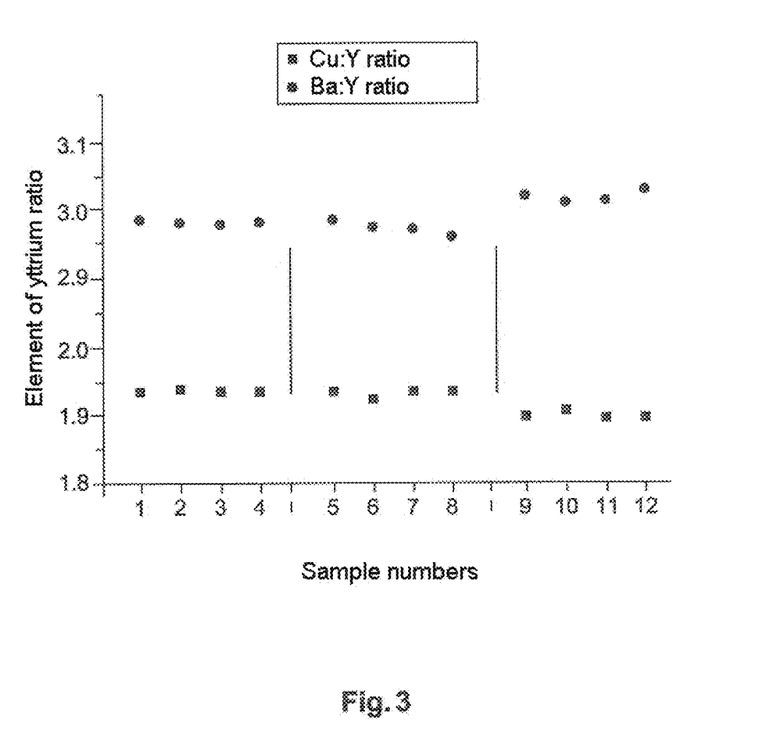
FIG. 3 the Cu:Y or Ba:Y ratio in a single YBCO layer (left), a single YBCO layer after ultrasound treatment (middle) and a double YBCO layer after ultrasound treatment (right), determined from the rinse solution by ICP-OES, FIG. 4 the SEM (scanning electron microscopy) image of a double YBCO layer after crystallization without (FIG. 4A) and with (FIG. 4B) intermediate cleaning by ultrasound in ethanol and FIG. 5 a schematic diagram, not to scale, of a composite of the invention.

While no measurable changes in stoichiometry are apparent in the layers, the complementary composition of the (concentrated) rinse solution differs, giving the following atomic ratios: Y:Ba:Cu=1:4.4:5.8. FIG. 3 shows the result of ICP measurements in pyrolyzed layers. Sample numbers 1 to 4 relate to single layers; sample numbers 5 to 6 relate to single layers with ultrasound cleaning; sample numbers 9 to 12 relate to double layers. It is found that removal of the interfacial layer by ultrasound treatment in ethanol brings about an increased degree of copper and barium loss.

The absolute amount of metal determined in the cleaning solution shows a decrease in the total layer thickness as a result of the cleaning of 10-15 nm. In these upper 10-15 nm of the pyrolyzed uncleaned layer, a distinct excess of copper and barium thus arises, which is defined as follows:

(Ba+Cu):Y=5:1 (HTS stoichiometry)
(Ba+Cu):Y=10:1 (stoichiometry of interfacial layer)

Figure 4A:
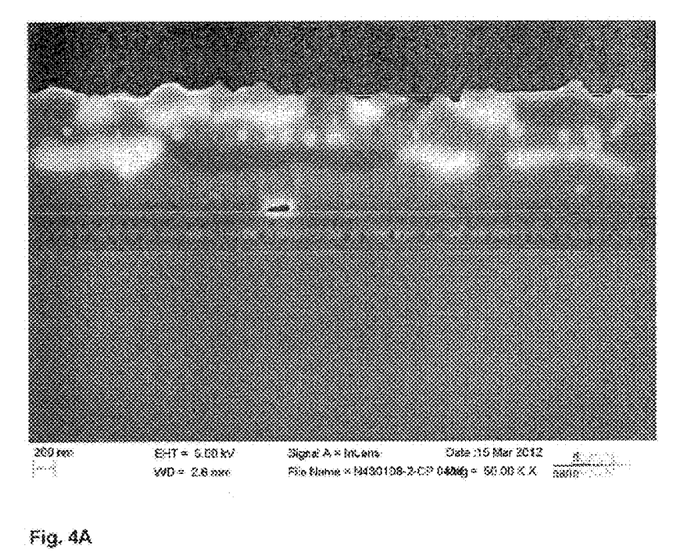
Figure 4B:
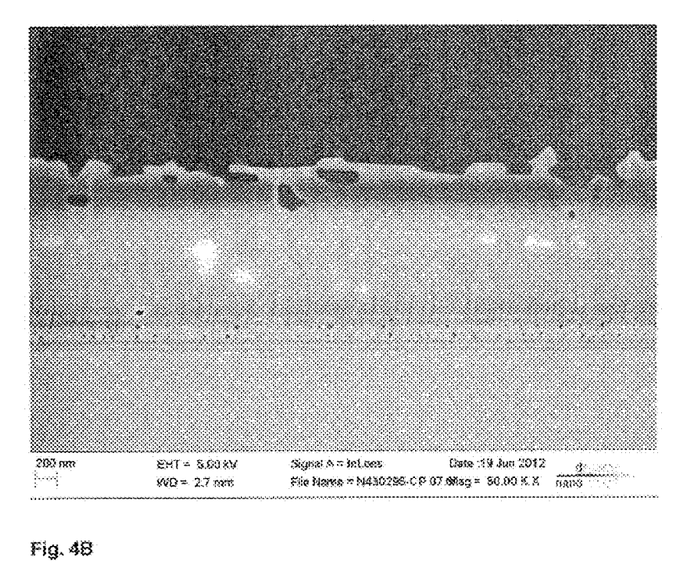

FIG. 4A, finally, shows an SEM image of a double layer after crystallization, but without intermediate cleaning, while FIG. 4B shows the same double layer after crystallization, but with intermediate cleaning. The differences are evident.

Studies have shown that optimal intertwining of the interfacial layer only exists when the (Ba+Cu):Y ratio in the interfacial layer (upper 10 nm of the pyrolyzed layer prior to the application of the subsequent layer) is below 8, preferably below 6.

EXAMPLE 2

In the example, which is otherwise the same as example 1, the removal of the interfacial layer was achieved, rather than with ultrasound, by means of counter-rotating brushes and by means of high-pressure slot dies directed onto the ribbon. The solvent used was likewise ethanol, but identical results were also found with methanol and isopropanol. The treatment time was likewise 2 min.

The analysis results (FIB-TEM) were substantially comparable, but it was not possible to conduct an ICP-OES analysis because of the large amount of solvent. However, TEM-DEX measurements again showed a (Ba+Cu):Y ratio of >9 in the upper 10 nm of the pyrolyzed uncleaned interfacial layer and of <7 after the treatment. The results of the double layer crystallization were analogous to the results in example 1.

EXAMPLE 3

In the example, which is otherwise the same as example 1, the removal of the interfacial layer was not mechanically assisted (as an example 2), but assisted by complexometry. By addition of NaCN to the ethanolic rinse solution (1% by weight), the removal and complexing of copper in particular is promoted. The treatment is effected in countercurrent in a continuous system without further mechanical assistance.

The ICP-OES analysis of the rinse solution has a metal ratio of Y:Ba:Cu of 1:2.8:7.3. Copper was thus preferentially removed and dissolved.

This again gives a similar (Ba+Cu):Y ratio of >10 in the upper 10 nm of the pyrolyzed interfacial layer and of <7 after the treatment.

The results of the double layer crystallization were analogous to the results in example 1.

EXAMPLE 4

The method of the invention can achieve not just homogenization of the sublayers prior to joint crystallization, but also a controlled variation of stoichiometry within a jointly crystallized layer.

In the present example, an overall layer of thickness about 1000 nm after the crystallization is applied in a controlled manner with two different deposition steps and two different stoichiometric compositions. First of all, a Ba-depleted YBCO sublayer is applied, in order to promote oriented nucleation at the interface to the substrate. After drying, pyrolysis and inventive removal of the interfacial layer, a YBCO layer having less of a barium deficit, if any, is applied on top, having optimized properties for crystal growth.

Finally, the overall layer is jointly crystallized. The method conditions for deposition, drying, pyrolysis and crystallization correspond to those described in detail in example 1 above.

By intermediate removal of the interfacial layer, it is possible to achieve completely textured crystal growth and hence combine the positive properties of the sublayers.

The invention claimed is:

1. A method for producing a composite comprising a high-temperature superconductor (HTS) layer based on rare earth metal-barium-copper oxide on a substrate with defined biaxial texture, comprising:
   A) applying a first HTS coating solution to the substrate;
   B) drying the first HTS coating solution to produce a first film;
   C) pyrolyzing the first film to produce a first pyrolyzed sublayer;
   D) removing an interfacial layer on the upper side of the first pyrolyzed sublayer to produce a first pyrolyzed sublayer with reduced layer thickness;
   E) applying a second HTS coating solution to the first pyrolyzed sublayer with reduced layer thickness;
   F) drying the second HTS coating solution to produce a second film;
   G) pyrolyzing the second film to produce a second pyrolyzed sublayer;
   H) optionally forming one or more further pyrolyzed sublayers on the second pyrolyzed sublayer; and
   I) crystallizing the overall layer formed from the pyrolyzed sublayers to complete the HTS layer,
   wherein the removal of the interfacial layer in D) is effected in such a way that a texture determined by the defined biaxial texture of the substrate is transferred to the first and also to the second pyrolyzed sublayer.

2. The method according to claim 1, wherein H) is implemented, with immediately preceding removal of an interfacial layer on the upper side of the respective previous second or further pyrolyzed sublayer.

3. The method according to claim 1, wherein a sufficient amount of the first pyrolyzed sublayer as interfacial layer is removed in D) that, after the removal, the mean atomic (Ba+Cu):Y ratio in the upper 10 nm of the first pyrolyzed sublayer is below 8 and/or H) is preceded by removal of a sufficient amount of the respective previous second or further pyrolyzed sublayer as interfacial layer that, after the removal, the mean atomic (Ba+Cu):Y ratio in the upper 10 nm of the respective previous second or further sublayer is below 8.

4. The method according to claim 1, wherein 1% to 20% of the first pyrolyzed sublayer as interfacial layer is removed in D), based on the layer thickness of the first pyrolyzed sublayer, and/or H) is preceded by removal of 1% to 20% of the respective previous second or further pyrolyzed sublayer as interfacial layer, based on the layer thickness of the respective previous second or further sublayer.

5. The method according to claim 1, wherein the removal of the interfacial layer is effected in a mechanical, chemical and/or physical manner.

6. The method according to claim 5, wherein the removal of the interfacial layer is effected by ultrasound, abrasion, irradiation, etching, pickling, plasma etching or dissolving in a suitable solvent, optionally in combination with one another or with other mechanical, chemical or physical treatment(s).

7. The method according to claim 1, wherein the HTS coating solution used is a solution for formation of an yttrium-barium-copper oxide layer.

8. The method according to claim 1, wherein a total of 2, 3, 4 or 5 pyrolyzed sublayers is formed.

9. The method according to claim 1, wherein the compositions of the respective coating solutions are different.

10. The method according to claim 1, wherein the pyrolyzed sublayers are formed in different layer thicknesses.

11. The method according to claim 1, wherein the layer thicknesses of the pyrolyzed sublayers are between 400 and 800 nm.

12. A composite comprising, on a substrate with defined texture, a high-temperature superconductor (HTS) layer comprising rare earth-barium-copper oxide,
wherein
the HTS layer consists of a plurality of sublayers deposited one on top of another,
each of the sublayers there is variation in the atomic (Ba+Cu):Y ratio in the direction at right angles to the substrate surface and
in each of the sublayers, with or without the exception of the uppermost sublayer, every sublayer of thickness 10 nm that extends parallel to the substrate surface is constituted such that the mean of said atomic ratio is not more than 8.

13. A composite produced by the method according to claim 1,
wherein said composite comprises a substrate with defined texture and a high-temperature superconductor (HTS) layer comprising rare earth-barium-copper oxide, and
wherein:
the HTS layer consists of a plurality of sublayers deposited one on top of another, in each of the sublayers there is variation in the atomic (Ba+Cu):Y ratio in the direction at right angles to the substrate surface, and in each of the sublayers, with or without the exception of the uppermost sublayer, every sublayer of thickness 10 nm that extends parallel to the substrate surface is constituted such that the mean of said atomic ratio is not more than 8.

14. The composite according to claim 13, wherein the overall layer composed of pyrolyzed sublayers after the crystallizing in I), in more than 80% of the volume, has a texture defined by the defined texture of the substrate.

15. The composite according to claim 12, which is an HTS in ribbon form.

* * * * *

UNITED STATES PATENT AND TRADEMARK OFFICE
CERTIFICATE OF CORRECTION

PATENT NO. : 10,333,050 B2
APPLICATION NO. : 15/320640
DATED : June 25, 2019
INVENTOR(S) : Martina Falter et al.

It is certified that error appears in the above-identified patent and that said Letters Patent is hereby corrected as shown below:

In the Specification

Column 3, Line 37, delete ""NTS" and insert -- "HTS --, therefor.

Column 7, Line 55, delete "TEM-DEX" and insert -- TEM-EDX --, therefor.

Signed and Sealed this
Twenty-first Day of April, 2020

Andrei Iancu
*Director of the United States Patent and Trademark Office*